(12) United States Patent
Yamada et al.

(10) Patent No.: US 7,907,376 B2
(45) Date of Patent: Mar. 15, 2011

(54) LOAD CONTROL DEVICE AND METHOD

(75) Inventors: Masao Yamada, Kariya (JP); Satoshi Yoshimura, Kariya (JP)

(73) Assignee: Denso Corporation, Kariya (JP)

( * ) Notice: Subject to any disclaimer, the term of this patent is extended or adjusted under 35 U.S.C. 154(b) by 1040 days.

(21) Appl. No.: 11/715,898

(22) Filed: Mar. 9, 2007

(65) Prior Publication Data

US 2007/0230224 A1 Oct. 4, 2007

(30) Foreign Application Priority Data

Apr. 4, 2006 (JP) ................................ 2006-103259
Nov. 9, 2006 (JP) ................................ 2006-304150

(51) Int. Cl.
*H02H 3/24* (2006.01)
(52) U.S. Cl. .......................................... 361/92; 361/88
(58) Field of Classification Search ................... 361/90, 361/86, 88, 91.2, 92, 93.7
See application file for complete search history.

(56) References Cited

U.S. PATENT DOCUMENTS

| | | | | |
|---|---|---|---|---|
| 4,145,650 A | * | 3/1979 | Poppinger et al. ............ | 323/287 |
| 4,803,592 A | * | 2/1989 | Ashley ............................ | 361/79 |
| 5,055,656 A | * | 10/1991 | Farah et al. .................... | 219/209 |
| 6,204,706 B1 | * | 3/2001 | Horvath ......................... | 327/198 |
| 6,608,900 B1 | * | 8/2003 | Yancey et al. ................. | 379/413 |
| 6,844,614 B2 | | 1/2005 | Yamada et al. | |
| 6,850,047 B2 | | 2/2005 | Itabashi et al. | |
| 6,912,141 B2 | | 6/2005 | Konno | |
| 6,987,677 B2 | | 1/2006 | Konno | |
| 7,372,683 B2 | * | 5/2008 | Yamamura et al. .......... | 361/91.1 |
| 2003/0090243 A1 | * | 5/2003 | Atherton ....................... | 323/239 |

FOREIGN PATENT DOCUMENTS

| | | |
|---|---|---|
| JP | U-63-70225 | 5/1988 |
| JP | U-05-23150 | 3/1993 |
| JP | A-06-335155 | 12/1994 |
| JP | A-2001-045790 | 2/2001 |
| JP | A-2005-312211 | 11/2005 |

OTHER PUBLICATIONS

Notice of Rejection mailed on Nov. 4, 2009 issued from the Japanese Patent Office in the corresponding Japanese patent application No. 2006-304150 (and English translation).

* cited by examiner

*Primary Examiner* — Jared J Fureman
*Assistant Examiner* — Terrence R Willoughby
(74) *Attorney, Agent, or Firm* — Posz Law Group, PLC

(57) ABSTRACT

A load control device includes a control circuit and a protection circuit. The control circuit controls driving of an electric load. The protection circuit monitors a power supply voltage supplied to the control circuit and stops control of driving the load by the control circuit, when the power supply voltage drops below a threshold value. The protection circuit provides the threshold value with a hysteresis characteristic having a width determined by a product of a wiring resistance of a path for supplying a driving current to the load and a maximum value of the driving current.

21 Claims, 7 Drawing Sheets

LOAD CONTROL DEVICE AND METHOD

CROSS REFERENCE TO RELATED APPLICATION

This application is based on and incorporates herein by reference Japanese Patent Applications No. 2006-103259 filed on Apr. 4, 2006 and No. 2006-304150 filed on Nov. 9, 2006.

FIELD OF THE INVENTION

The present invention relates to a load control device having a protection function of monitoring power supply voltage supplied to a control circuit for controlling driving of a load and stopping control on the driving of the load when the power supply voltage drops below a threshold value, and a load control method.

BACKGROUND OF THE INVENTION

To prevent malfunction and ensure the stability of electronic control, some devices for controlling driving of a load, driven by a large current, by a control integrated circuit (IC) are provided with low voltage protection function. This function is such that when it is detected that a power supply voltage has dropped to some degree, drive control by the control IC is stopped.

Figure 10:
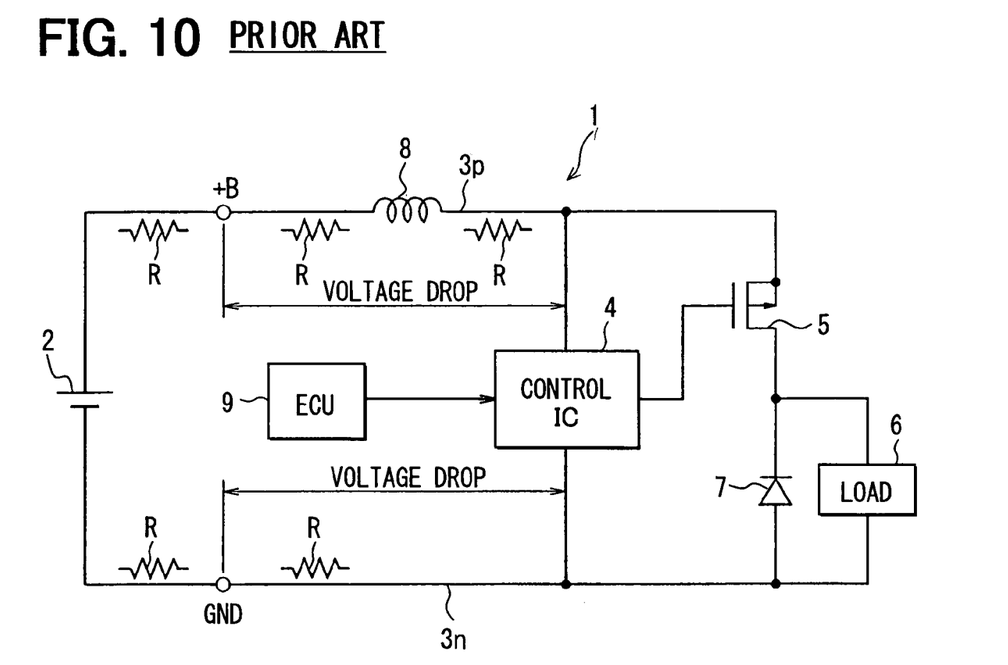
FIG. 10 is a circuit diagram illustrating a conventional load control device.

U.S. Pat. No. 6,912,141 (JP 2003-79146A) discloses an example of such a device having the low voltage protection function. As shown in FIG. 10, the device for driving of a load mounted in, for example, a vehicle as an example of a control device is provided with the above protection function.

A control unit 1 is so constructed that its power supply terminal (+B) and ground terminal (GND) are connected with a battery 2 of a vehicle. The power supply voltage is, for example, 12V or so. In the control unit 1, a control IC 4 is connected between power wires 3p, 3n and further a series circuit of a p-channel MOSFET 5 and a load 6 is connected. A flywheel diode 7 is connected in parallel with the load 6. A smoothing inductor 8 is placed in the power wire 3p.

Upon receiving a control signal supplied from an external electronic control unit (ECU) 9, the control IC 4 outputs a gate signal to the FET 5 to control driving of the load 6. However, the ECU 9 exists outside the control unit 1. The control IC 4 monitors the voltage level of power internally supplied to itself, and is so constructed that when that voltage drops to 6V or so, for example, it stops driving of the load 6.

However, in this device, the power wire 3p constructed of a bus bar and the wiring pattern, thick film conductor wiring, and the inductor 8 on a printed board, and the like have a resistive component R. When a load current may continue to be excessively increased, for example, a voltage drop occurs in correspondence with the current. The power supply voltage to the load 6 drops with increase in the load current. When the low voltage protection is triggered, driving of the load 6 is stopped and the load current does not flow any more.

Figure 11:
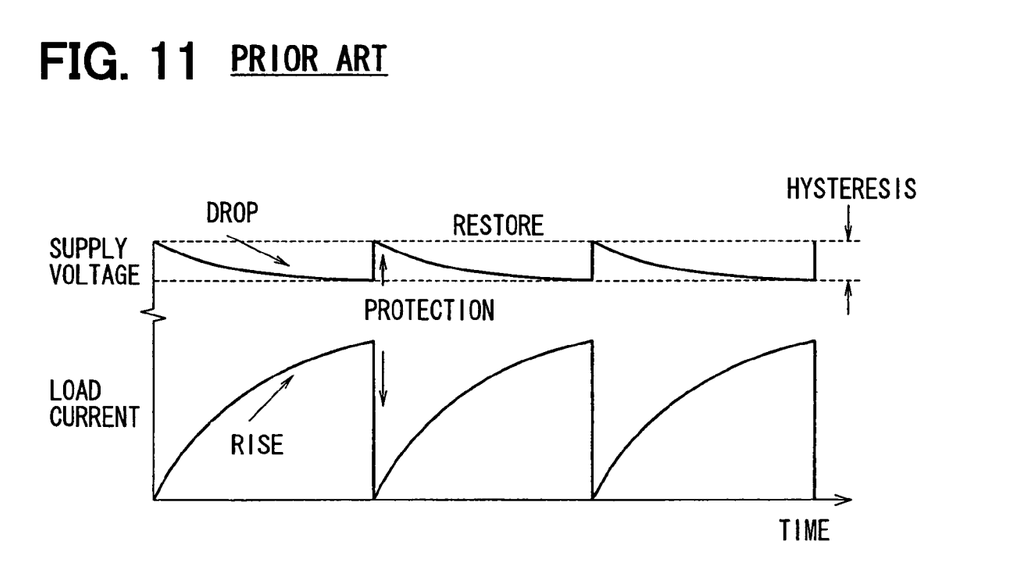
FIG. 11 is an operation diagram illustrating a supply voltage and a load current in the conventional load current device.

Thus, voltage drop by the resistive component R in the power supply path is eliminated and the power supply voltage is increased again. As a result, drive control is resumed by the control IC 4. When this control is resumed, low voltage protection is triggered by voltage drop again. Therefore, hunting occurs and control is repeatedly and alternately stopped and resumed at short time intervals as shown in FIG. 11. When the low voltage protection is carried out, generally, hysteresis characteristics are provided in voltage detection for preventing erroneous detection. However, the hysteresis width is set to a value equal to or lower than the voltage range specification of a product. No consideration is given to the amount of voltage drop caused by wiring resistance.

When such hunting occurs, some kinds of loads to be driven may produce abnormal noise, and this brings discomfort to the user.

SUMMARY OF THE INVENTION

The invention has an object to provide a device and a method for load control, wherein the occurrence of the hunting phenomenon can be avoided when a state in which a load current has increased continues to exist.

According to one aspect of the present invention, a load control device includes a control circuit and a protection circuit. The control circuit controls driving of a load. The protection circuit monitors a power supply voltage supplied to the control circuit and stops control of driving the load by the control circuit, when the power supply voltage drops below a threshold value. The protection circuit provides the threshold value with a hysteresis characteristic having a width equal to or larger than a voltage drop level based on a wiring resistance of a path for supplying a driving current to the load and a maximum value of the driving current. For instance, the width of the hysteresis is determined to be a product of the wiring resistance and the maximum value of the driving current.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
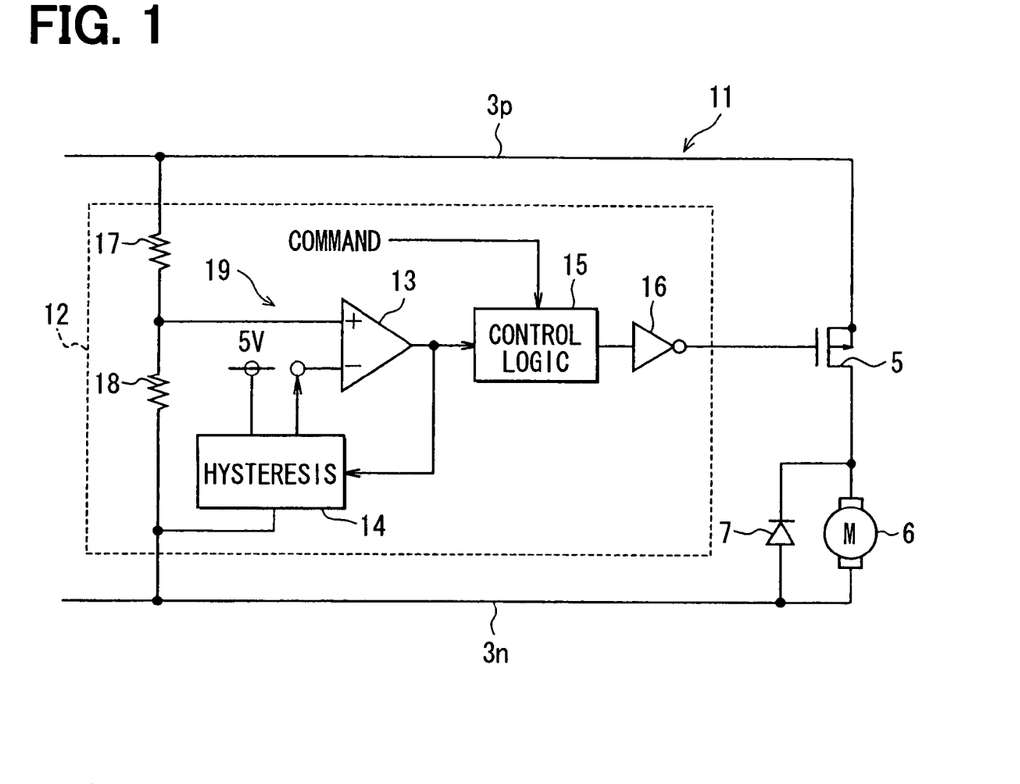
FIG. 1 is a circuit diagram illustrating a load control device applied to a control device for a blower motor mounted in a vehicle according to a first embodiment of the invention.

Referring to FIG. 1, a first embodiment of a control device is applied to a blower motor that is mounted in a vehicle and used in, for example, an air conditioner. The same parts as in FIG. 10 are marked with the same reference numerals, and the description of them will be omitted. Hereafter, description will be given only to differences. In FIG. 1, a load control unit 11 has a control IC 12, which is a replacement of the control IC 4 in the conventional control unit 1.

The control IC 12 is constructed of a comparator 13 for monitoring a power supply voltage, a hysteresis setting circuit 14, a control logic circuit 15, a gate driver 16, and the like. The comparator 13 detects a voltage drop by comparing a voltage obtained by dividing the power supply voltage by voltage dividing resistors 17 and 18 (at a voltage dividing ratio of 1/8 or so, for example) with a reference voltage set at the hysteresis setting circuit 14. The hysteresis setting circuit 14 is constructed of a combination of a resistor and a transistor, for example, or of a logic circuit and the like, and sets a reference voltage based on 5V power supply. In case of this embodiment, the reference voltage for detecting the voltage drop is set to 6V, and hysteresis characteristic is so provided: that when the voltage once dropped below 6V rises again, the comparator 13 changes its output from low level to high level only after the voltage rises to 8V, which is a value obtained by adding 2V to 6V. This is performed by referring to the output level of the comparator 13. The comparator 13, hysteresis setting circuit 14, and voltage dividing resistors 17 and 18 construct a protection circuit 19.

The control logic circuit 15 is so constructed that it performs the following operation: it internally and logically processes a control command supplied from ECU 9 (not shown in FIG. 1), and outputs a gate signal for FET 5 through the gate driver 16. The control logic circuit 15 performs the above operation when the output of the comparator 13 at the high level and is reset when the output transitions to the low level. This is because when the power supply voltage greatly drops, the normal operation of the control logic circuit 15 is not guaranteed. In this embodiment, the load 6 is a blower motor 6, and it rotates a fan, not shown, to send air in an air conditioner for a vehicle.

The hysteresis setting circuit 14 sets the above hysteresis shown in FIG. 2 as follows: it will be assumed that in the specifications for the drive system, the maximum value (limit value) of the load current supplied through the FET (semiconductor element) 5 and the motor 6 is 80 A and the resistance of wiring, including the power wire 3p, 3n constructed of, for example, a bus bar or the like and the inductor 8, is 10 mΩ. When the maximum current of 80 A is supplied, the voltage drop that takes place in the power wire 3p, 3n is 0.8V. Consequently, the hysteresis width is set to 2V to provide that value with a margin. In the case of the conventional construction illustrated in FIG. 10, the hysteresis width is 0.4V or so.

Figure 2:
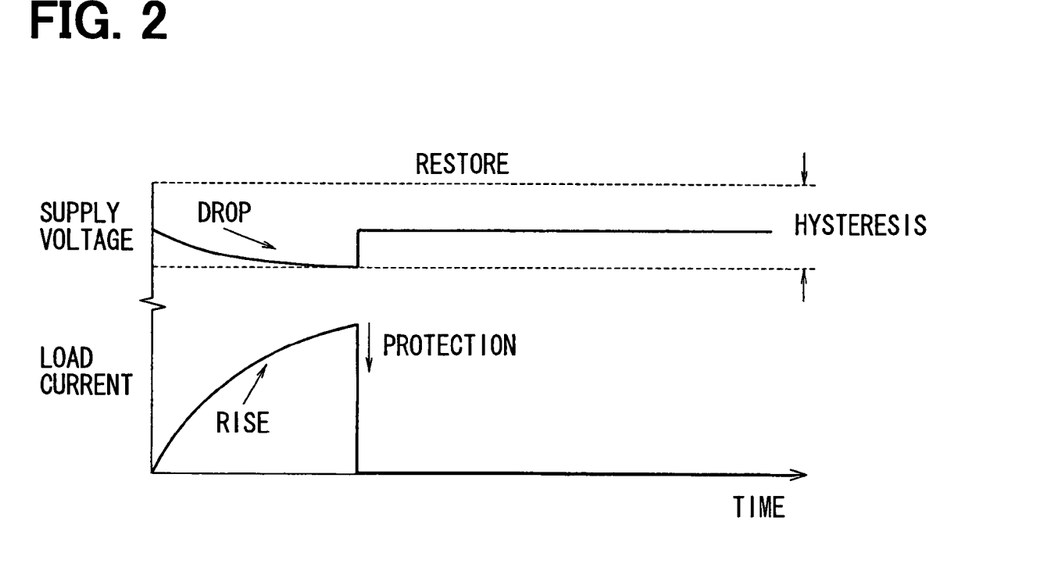
FIG. 2 is an operation diagram illustrating a supply voltage and a load current in the control device according to the first embodiment.

Setting the hysteresis width as above provides the effect illustrated in FIG. 2, even when the low voltage protection by the protection circuit 19 is triggered and driving of the motor 6 is stopped and the load current does not flow any more. Even if the power supply voltage rises as a result, the occurrence of hunting is avoided because a sufficient hysteresis width is set with voltage drop due to a wiring resistance component taken into account.

According to this embodiment, the following is implemented: the control IC 12 provides the hysteresis setting circuit 14 that constructs the protection circuit 19 with such a hysteresis characteristic that the following is implemented: the threshold value for monitoring the power supply voltage supplied to the control IC 12—the logic control circuit 15 for performing protecting operation has a width equal to or larger than the level of voltage drop based on the wiring resistance of the path for supplying the load current to the motor 6 and the maximum value of the load current. Therefore, drive control by the control IC 12 is not resumed until the power supply voltage is restored to its substantial normal level, and the occurrence of hunting can be prevented. It can be avoided that the intermittent driving sound from the motor 6 makes abnormal noise and brings discomfort to the user.

Second Embodiment

Figure 3:
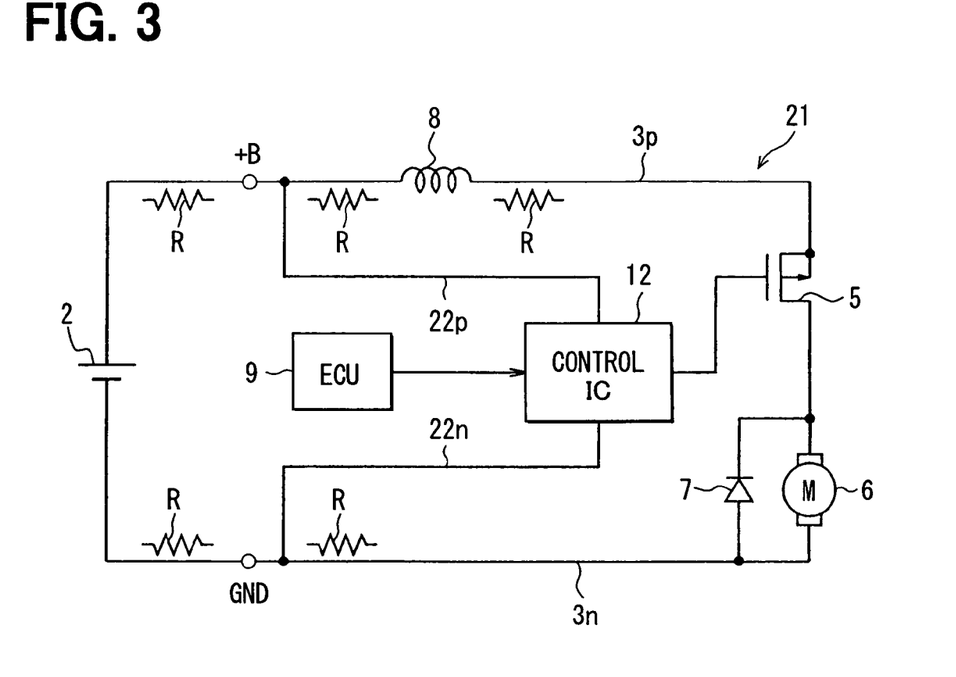
FIG. 3 is a circuit diagram illustrating a load control device according to a second embodiment of the invention.

In a second embodiment shown in FIG. 3, a load control unit 21 is so constructed that the power supply to the control IC 12 is carried out from the vicinity of power supply terminals +B, GND using dedicated power wire 22p, 22n. In this case, a material whose resistance value is lower than that of the power wires 3p, 3n is used for the power wire 22p, 22n.

The power supply to the control IC 12 is carried out from the vicinity of the power supply terminals +B, GND using the dedicated power wire 22p, 22n that belongs to a system different from the system to which the path of current supply to the motor 6 belongs. Therefore, it is possible to make the control IC 12 less prone to be influenced by the voltage drop.

Third Embodiment

Figure 4:
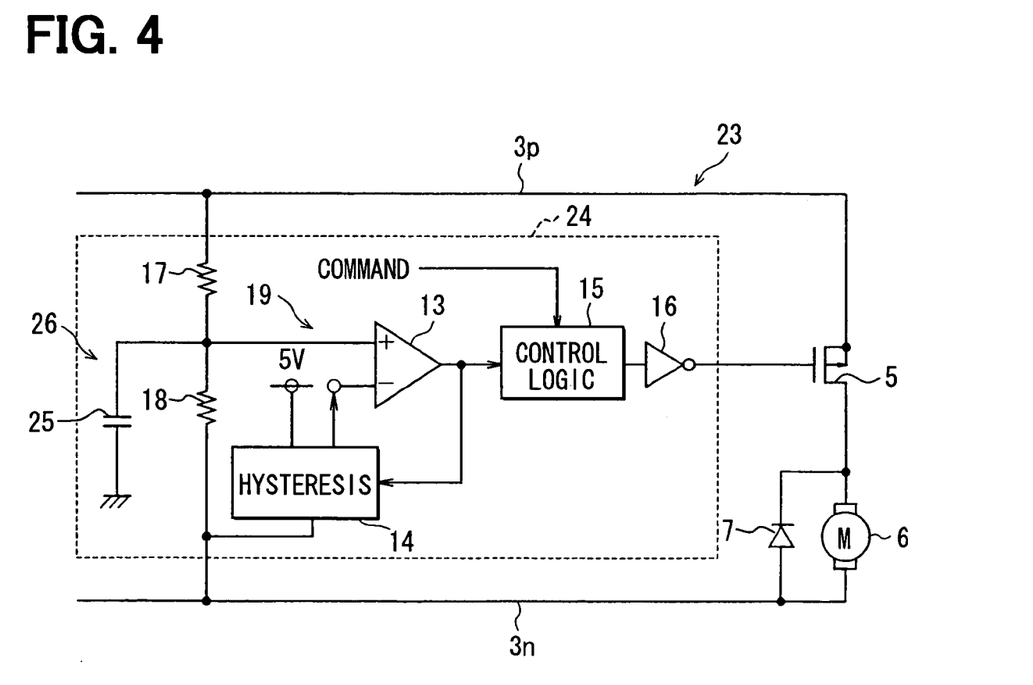
FIG. 4 is a circuit diagram illustrating a load control device according to a third embodiment of the invention.

In a third embodiment shown in FIG. 4, a load control unit 23 is so constructed that the following is implemented: in a control IC 24 (load control device), a capacitor 25 is connected in parallel with the voltage dividing resistor 18, and the voltage dividing resistor 17 and the capacitor 25 construct an integration circuit 26. The comparator 13 monitors the integration value of the power supply voltage. That is, a slight time delay is introduced in detecting the power supply voltage. Therefore, even in such a case that the power supply is instantaneously interrupted and a voltage varies in terms of noise in a short time, for example, it can be avoided that the voltage drop due to noise is immediately detected and the protection function is carried out.

Fourth Embodiment

Figure 5:
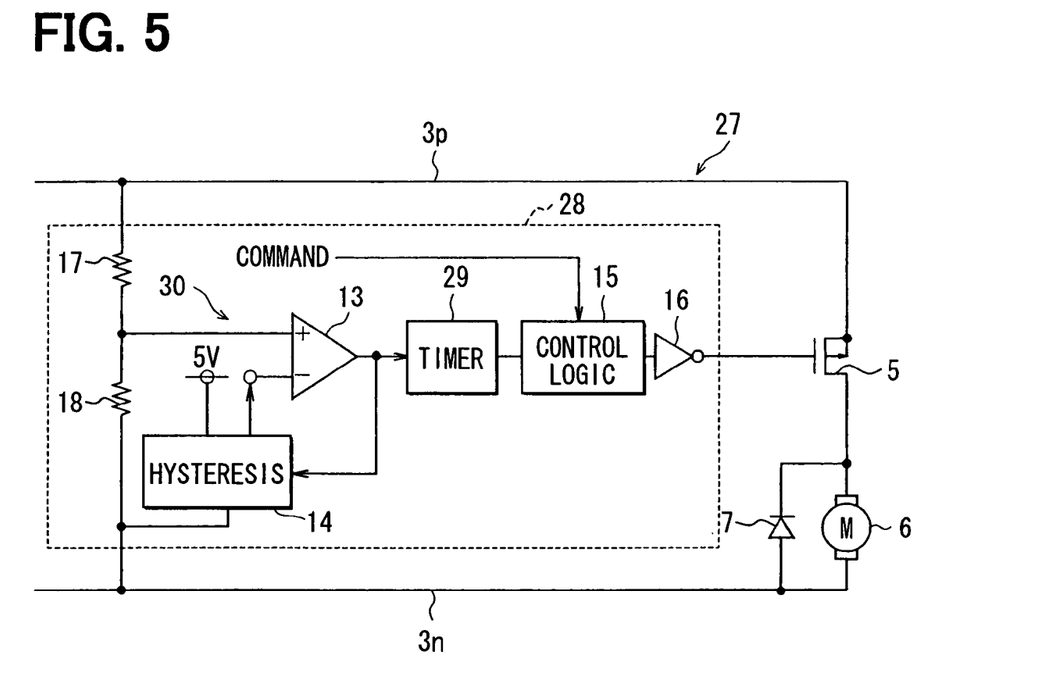
FIG. 5 is a circuit diagram illustrating a load control device according to a fourth embodiment of the invention.

In a fourth embodiment shown in FIG. 5, a load control unit 27 is constructed by adding a timer 29 between the output terminal of the comparator 13 and the control logic circuit 15 in a control IC 28 (load control device). This timer 29 is so constructed as to operate as follows: it starts time counting, taking a rising edge of the output signal of the comparator 13 as a trigger (reset start); when, for example, 50 ms (predetermined time) elapses, its output level transitions from low to high and it cancels the resetting of the control logic circuit 15. Therefore, at least the time of 50 ms or longer is required for control by the control IC 28 to be resumed after the power supply voltage drops below 6V. The timer 29 and the protection circuit 19 in the first embodiment provides a protection circuit 30.

According to the fourth embodiment, the protection circuit 30 causes the control logic circuit 15 to resume control when 50 ms has elapsed after it stops the control and then the power supply voltage is restored. Therefore, even when the voltage change larger than the hysteresis width occurs and the above sequence is periodically repeated, for example, the production of abnormal noise can be prevented by controlling the period to a value lower than an audio frequency range.

Fifth Embodiment

Figure 6:
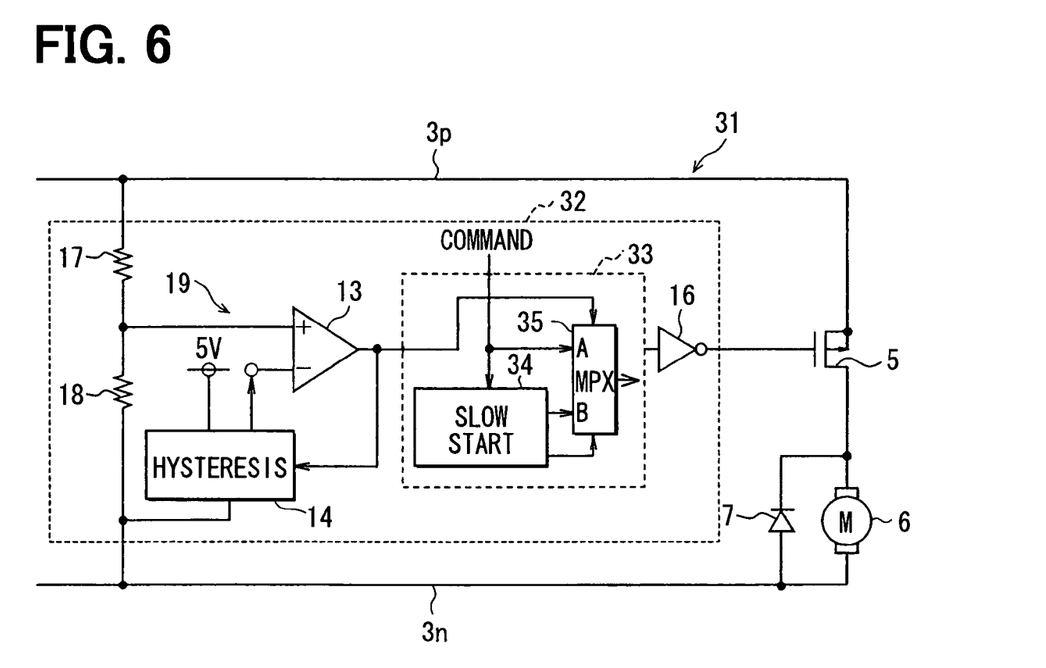
FIG. 6 is a circuit diagram illustrating a load control device according to a fifth embodiment of the invention.

In a fifth embodiment shown in FIG. 6, a load control unit 31 has a control logic circuit 33 in a control IC 32 (load control device). The control logic circuit 33 incorporates a slow start control circuit 34 and a multiplexer (MPX) 35. The multiplexer 35 is inputted with the control command directly supplied from the ECU 9 and a control command that is supplied through the slow start control circuit 34.

The multiplexer 35 is so constructed that the following is implemented: in the normal operation, the input side A on which the control command is directly inputted is selected; when the rising edge of the output of the comparator 13 is detected, the input side B on which the control command is inputted through the slow start control circuit 34 is selected. The slow start control circuit 34 performs a slow start operation (JP 2001-45790A, for example.) It starts output at the level of zero and carries out processing so as to gradually (for example, linearly) increase its output level so that the level reaches the level of the control command given at that point of time when a predetermined time has elapsed. When the output level reaches the level of the control command, the slow start control circuit outputs a reset signal to the multiplexer 35. Then, the multiplexer 35 selects the side A for direct input again.

According to the fifth embodiment, the slow start control circuit 34 is incorporated in the control logic circuit 33. As a result, the control IC 32 carries out the slow start processing when resuming control and starts driving of the load from the lowest level. Therefore, when the control is resumed, a rush current can be restricted from being supplied through the motor 6 and causing the power supply voltage to drop.

Sixth Embodiment

Figure 7:
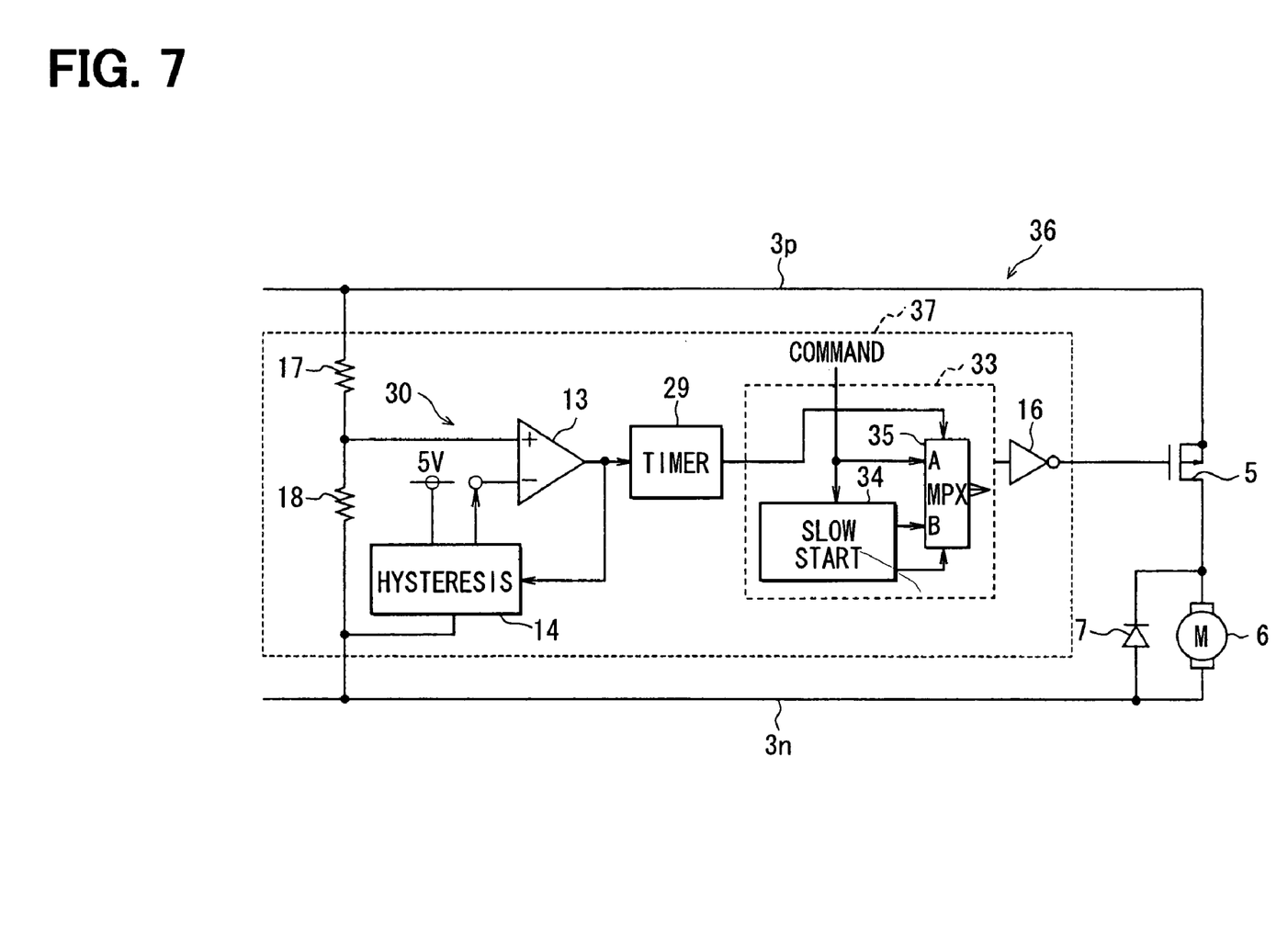
FIG. 7 is a circuit diagram illustrating a load control device according to a sixth embodiment of the invention.

In a sixth embodiment shown in FIG. 7, a load control unit 36 is constructed by combining the fourth and fifth embodiments. In a control IC 37 (load control device), the timer 29 in the fourth embodiment and the control logic circuit 33 in the fifth embodiment are connected in series. According to the sixth embodiment, the same effects as in the fourth and fifth embodiments can be achieved.

Seventh Embodiment

Figure 8A:
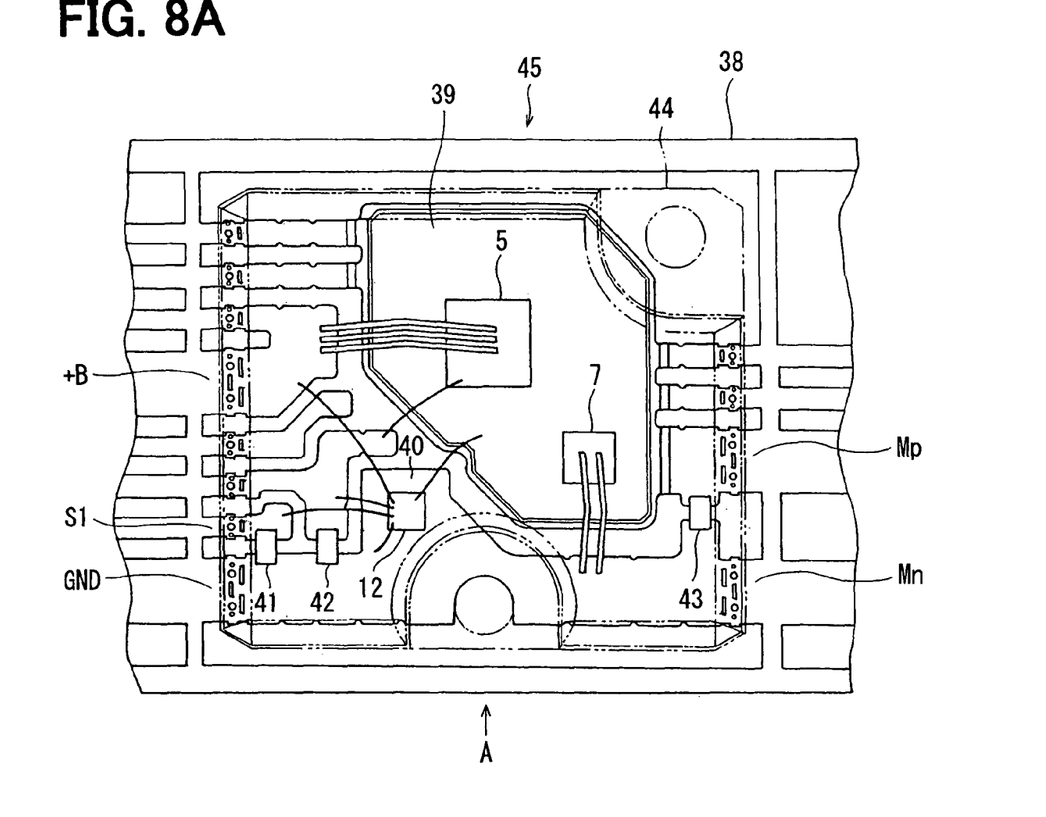
FIGS. 8A and 8B are a plan view and a side view illustrating a load control device and a hybrid IC used in the load control device according to a seventh embodiment of the invention, respectively.
Figure 8B:
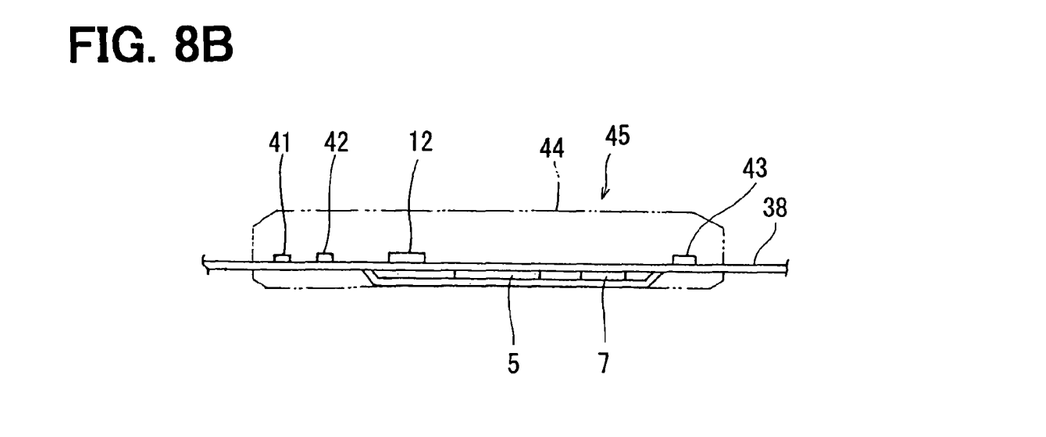

In a seventh embodiment shown in FIGS. 8A and 8B, a hybrid IC is formed, for example, by mounting a semiconductor chip of the control IC 12 in the first embodiment and respective semiconductor chips of FET (transistor) 5 and the flywheel diode 7 over one lead frame 38, and molding them into a package.

An island 39 of the lead frame 38 is mounted with the chips (circuit elements) of the FET 5 and the diode 7. An island 40 positioned on the lower left of the island 39 in FIG. 8A is mounted with the chip of the control IC 12. Chip capacitors (circuit elements) 41 to 43, are connected in parallel with the diode 7 between a signal wire for the control command inputted to the control logic circuit 15 and the power wire $3n$ or between the gate of the FET 5 and the power wire $3n$, for example, for noise rejection. In FIG. 8A, code +B denotes the power supply terminal connected to the power wire $3p$; GND denotes the ground terminal connected to the power wire $3n$; S1 denotes an input terminal for the control command; and Mp and Mn respectively denote terminals (leads) connected to the power supply side and the ground side of the motor 6.

As shown in FIG. 8B showing the hybrid IC as viewed from the direction of arrow A in FIG. 8A. The entire hybrid IC is encapsulated in a resin mold 44 and thus packaged, and the above elements construct the hybrid IC 45. This construction is basically the same as disclosed in U.S. Pat. No. 6,844,614 (JP 2004-140305A).

The hybrid IC 45 is required to be formed in small size with a minimum number of terminals for the sake of versatility. Therefore, limitations are imposed on this hybrid IC 45 with respect to mold size, number of terminals, routing of internal wiring, and the like. Therefore, when a relatively large current is handled, voltage drop that occurs until power is supplied from the power supply terminal $3p$ to the control IC 12 becomes larger. However, the above embodiments effectively prevent the occurrence of hunting.

The hybrid IC 45 also incorporates the FET 5 for driving the motor (inductive load) 6 and the flywheel diode 7 in addition to the control IC 12, and thus it is constructed as a smart actuator. Therefore, it is possible to connect the motor 6 directly to the hybrid IC 45 when driving the motor 6, and to further reduce the overall size including a drive element.

Eighth Embodiment

Figure 9A:
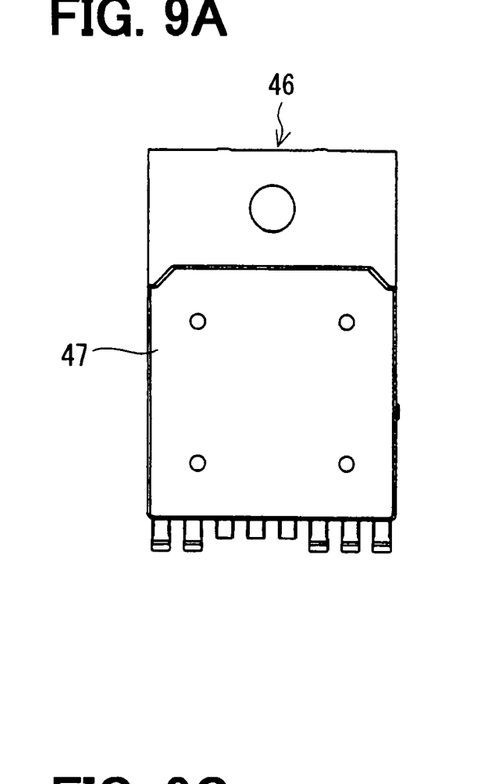
FIGS. 9A to 9D are a front view, a side view, a rear view and another side view illustrating a hybrid IC used in a load control device according to an eighth embodiment of the invention.
Figure 9B:
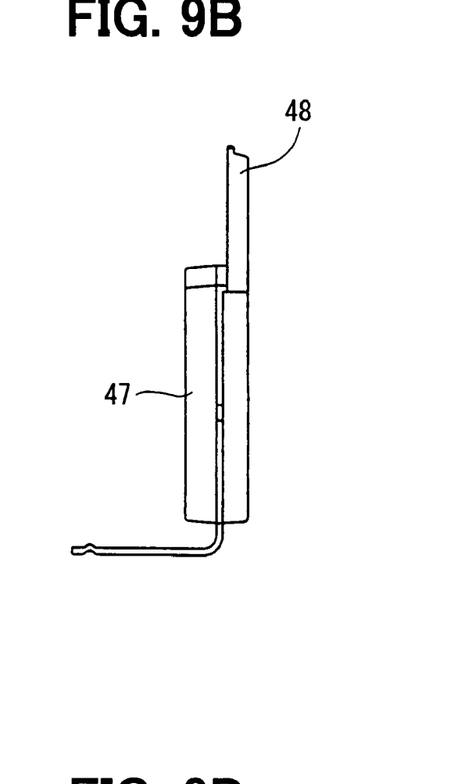
Figure 9C:
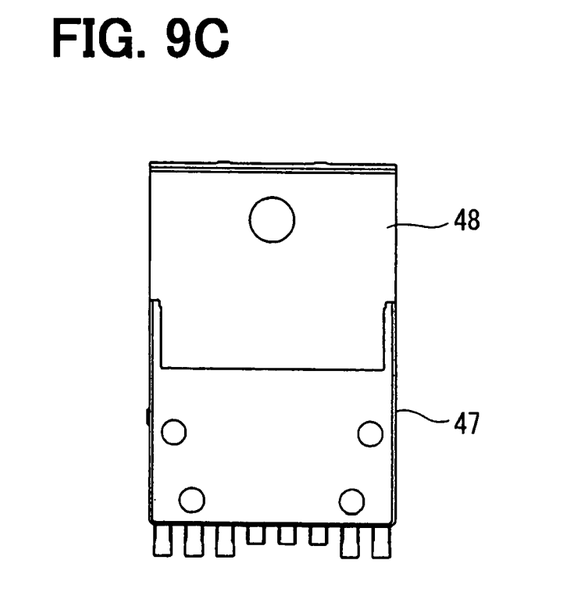
Figure 9D:
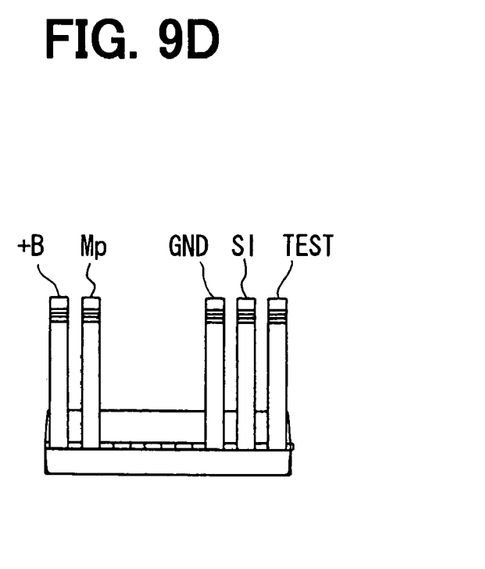

In an eighth embodiment shown in FIGS. 9A to 9D, a hybrid IC 46 is constructed differently from that in the hybrid IC 45 in the seventh embodiment. The hybrid IC 46 includes a heat sink 48 connected to the lead frame in a mold resin package 47. As illustrated in FIG. 9A, five external terminals +B, Mp, GND, S1, TEST are disposed so that they are lined on the lower hem of the mold resin package 47. As illustrated in FIGS. 9B and 9D, these terminals are extended as are bent toward the front side of the main body in L shape.

The terminal TEST, which is not shown in FIG. 8A or 8B, is a terminal that is brought to the high level to change the mode to test mode when the functions of the internal control IC 12 are tested. When the hybrid IC is used in the normal operation mode, the terminal TEST is connected to the ground.

According to the eighth embodiment, the external terminals of the hybrid IC 46 are so disposed that they are lined on the same hem of the package 47. Therefore, when the hybrid IC 46 is mounted over a board, space saving can be achieved.

The invention is not limited to the embodiments mentioned above or illustrated in the figures, and can be modified as described below.

The hysteresis width can be appropriately set based on the maximum value of driving current and the wiring resistance of a current path according to individual designs. Margin in the hysteresis width can be appropriately set, and a margin need not always be provided.

Aside from the foregoing, the load may be those that output sonic wave signals, such as speaker, buzzer, or horn or those that output optical signals, such as lamp. When the load is any of them and hunting occurs, output is produced in such a pattern that sound is intermittently produced or light flashes. Therefore, when the invention is applied to a control device whose load is any of them, the hunting suppressing effect is attained remarkably. Alternatively, the load may be a solenoid or the like.

The invention may also be applied to a load low-side drive system.

The semiconductor element may be an n-channel MOSFET, a power transistor, IGBT, or the like.

The setting of the predetermined time described in relation to the fourth embodiment can be changed as appropriate.

The construction of the hybrid IC is not limited to those described in relation to the seventh and eighth embodiments. Other circuit elements can be appropriately selected according to individual designs.

The invention may be applied to a multichip package, which is formed by mounting multiple IC chips over a lead frame, as in the seventh and eighth embodiments.

The invention can be applied not only to control devices for blower motor but also to motor control devices for a radiator fan or a fuel pump.

The invention can be applied not only to those that drive a load mounted in a vehicle but also to a wide range of devices.

What is claimed is:

1. A load control device comprising:
a power source for supplying a power supply voltage;
a control circuit that controls driving of a load;
a protection circuit that monitors the power supply voltage supplied to the control circuit and stops control by the control circuit when the power supply voltage drops below a threshold value;
a first wiring that supplies a current to the load from a terminal to which the power supply voltage is supplied, the first wiring including a smoothing inductor; and
a second wiring that is directly connected to the terminal and supplies the power supply voltage to the control circuit from the terminal of the power supply voltage, the second wiring being different from the first wiring and connected between the smoothing inductor and the terminal of the power supply voltage, wherein
the protection circuit has a means to provide the threshold value with a hysteresis characteristic having a width equal to or larger than a voltage drop level based on a wiring resistance of a path for supplying a driving current to the load and a maximum value of the driving current.

2. The load control device of claim 1, wherein
the protection circuit includes:
an integration circuit that smoothes the power supply voltage; and
a comparator that compares the power supply voltage of the integration circuit with a threshold reference.

3. The load control device of claim 1, wherein
the protection circuit includes:
a timer that causes the control circuit to resume control only after a predetermined time has elapsed from restoration of the power supply voltage, when the protection circuit once stops the control.

4. The load control device of claim 1, wherein
the control circuit includes:
a slow start circuit that, when the control circuit resumes control, starts driving of the load from a lowest level and gradually increases a level to a level corresponding to a command value externally applied at that point of time.

5. The load control device of claim 1, wherein
the load is an electric motor.

6. The load control device of claim 1, wherein
the load is a device that outputs sonic wave signals.

7. The load control device of claim 1, wherein
the load is a device that outputs optical signals.

8. The load control device of claim 1, wherein:
the control circuit and the protection circuit are integrated in an IC chip;
the IC chip and other circuit element chips are mounted on a lead frame and package-molded as a hybrid IC.

9. The load control device of claim 8, wherein
one of the circuit element chips is a transistor for supplying the current to the load.

10. The load control device of claim 9, wherein
the load is an inductive load, and another of the circuit element chips is a flywheel diode connected in parallel with the transistor.

11. The load control device of claim 1, further comprising:
a third wiring that connects ground with the load, the first and third wirings forming the path for supplying the driving current to the load; and
a fourth wiring that connects ground with the control circuit, the second and fourth wirings being dedicated power wires that form a power system different from that which powers the load through the first and third wirings.

12. A load control method comprising the steps of:
monitoring a power supply voltage supplied by a power source to a control circuit for controlling driving of a load;
stopping control by the control circuit when the power supply voltage drops below a threshold value;
changing the threshold value by adding a hysteresis when the control is stopped, the hysteresis having a width equal to or larger than a voltage drop level determined based on a wiring resistance of a path for supplying a driving current to the load and a maximum value of the driving current;
resuming the control by the control circuit when the power supply voltage rises above the threshold value changed with the hysteresis;
supplying the power supply voltage from a terminal of the power source to the load through a first wiring; and
supplying the power supply voltage from the terminal of the power source to the control circuit through a second wiring, the second wiring being directly connected to the terminal of the power source, being different from the first wiring, and having a lower resistance than the first wiring.

13. The load control method of claim 12, further comprising:
integrating the power supply voltage, wherein
the step of monitoring monitors the power supply voltage integrated by the step of integrating.

14. The load control method of claim 12, further comprising:
resuming the control by the control circuit only when a predetermined time has elapsed after the power supply voltage is restored to be above the threshold value, when the control is stopped.

15. The load control method of claim 12, further comprising:
resuming the control of diving of the load from a lowest level and a level is gradually increased to a level corresponding to a command value externally given at that point of time, when the power supply voltage is restored to be above the threshold value.

16. The load control method of claim 12, wherein
the load is an electric motor.

17. The load control method of claim 12, wherein
the load is a device that outputs sonic wave signals.

18. The load control method of claim 12, wherein
the load is a device that outputs optical signals.

19. The load control method of claim 12, wherein
the width of the hysteresis is determined to be larger than a product of the wiring resistance and the maximum value of the driving current.

20. The load control method of claim 12, wherein
supplying the power supply voltage from the terminal of the power source to the load through a first wiring includes supplying the power supply voltage through a smoothing conductor; and
supplying the power supply voltage from the terminal of the power source to the control circuit includes supplying the power supply voltage directly from the terminal of the power source to the control circuit.

21. The load control method of claim 12, wherein:

the path for supplying the driving current to the load includes the first wiring and a third wiring that connects ground with the load, and the control circuit is connected with ground through a fourth wiring, the second and fourth wirings being dedicated power wires that form a power system different from that which powers the load through the first and third wirings.

* * * * *